(12) United States Patent
Cheng

(10) Patent No.: US 8,767,409 B2
(45) Date of Patent: Jul. 1, 2014

(54) STACKED SUBSTRATE STRUCTURE

(75) Inventor: Tsung-Jung Cheng, Nantou County (TW)

(73) Assignees: Universal Scientific Industrial (Shanghai) Co., Ltd., Shanghai (CN); Universal Global Scientific Industrial Co., Ltd., Nantou County (TW)

( * ) Notice: Subject to any disclaimer, the term of this patent is extended or adjusted under 35 U.S.C. 154(b) by 161 days.

(21) Appl. No.: 13/470,301

(22) Filed: May 12, 2012

(65) Prior Publication Data
US 2013/0201648 A1    Aug. 8, 2013

(30) Foreign Application Priority Data
Feb. 8, 2012 (TW) .............................. 101104028 A

(51) Int. Cl.
*H01R 12/16*    (2006.01)

(52) U.S. Cl.
USPC ............ 361/790; 361/763; 361/770; 361/784

(58) Field of Classification Search
CPC ....... H05K 1/144; H05K 1/44; H05K 1/0219; H05K 1/183; H05K 2201/042; H01L 25/105; A61K 2039/505; A61K 2039/51
USPC .......................... 361/770–790; 257/685–686
See application file for complete search history.

(56) References Cited

U.S. PATENT DOCUMENTS

| | | | | |
|---|---|---|---|---|
| 6,472,735 | B2 * | 10/2002 | Isaak | 257/686 |
| 6,787,916 | B2 * | 9/2004 | Halahan | 257/777 |
| 7,126,829 | B1 * | 10/2006 | Yen | 361/803 |
| 2003/0064548 | A1 * | 4/2003 | Isaak | 438/108 |
| 2004/0169275 | A1 | 9/2004 | Danvir et al. | |
| 2008/0283992 | A1 * | 11/2008 | Palaniappan et al. | 257/686 |
| 2010/0148339 | A1 * | 6/2010 | Lopez et al. | 257/686 |

FOREIGN PATENT DOCUMENTS

TW    I294673    3/2008
TW    I334634    12/2010

OTHER PUBLICATIONS

Taiwan Patent Office, Patent Search Report issued on Nov. 18, 2013.

* cited by examiner

*Primary Examiner* — Tuan T Dinh
(74) *Attorney, Agent, or Firm* — Li & Cai Intellectual Property (USA) Office

(57) ABSTRACT

The instant disclosure provides a self-sealed stacked structure which includes a substrate unit, a first frame, a conductive unit and a blocker unit. The substrate unit includes a first and a second substrate, and a first frame sandwiched there-between. The conductive unit includes a plurality of first conductors and second conductors electrically connecting the first substrate, the first frame and the second substrate. The first and the second conductors are in electrical connection. A blocker unit including at least two first and at least two second blockers are surroundingly arranged around the plurality of first and second conductors, respectively. The first substrate and the first frame are connected in a sealed manner through the first blockers combined by the solder, where the first frame and the second substrate are connected in a sealed manner through the second blockers combined by the solder.

5 Claims, 11 Drawing Sheets

(a)

(b)

(c)

(a)

(b)

STACKED SUBSTRATE STRUCTURE

BACKGROUND OF THE INSTANT DISCLOSURE

1. Field of the Instant Disclosure

The instant disclosure relates to a stacked substrate structure; in particular, to a self-sealed stacked substrate structure for use on a printed circuit board.

2. Description of Related Art

The rapid development of the consumer electronics provides new products rapidly to meet the different demands of the consumers. In order to stimulate and trigger the consumers' impulse for purchase, new electronic products are designed towards minimization yet at the same time with stronger functionality. As the printed circuit boards in miniaturized products are required to be thinner and smaller, the development of modern compact circuit boards inevitably trends toward multiple stacked structure with higher component density and enhanced capability. Thus, it is a critical issue at the design stage to obtain a fine electrical conductivity on a printed circuit board, where the signals will not be interrupted and the circuits will function as what is demand.

With reference to FIG. 1, a plurality of electrical components 13 are placed on the first substrate 11 and the second substrate 12. When the first and the second substrates 11 and 12 are put together in a stacked manner, in order to prevent short circuit due to the mutual contact of the electrical components 13 in the substrates 11 and 12, a frame 14 is often arranged between the first and the second substrate 11 and 12 for creating separation there-between. For the structure of the frame 14, the frame 14 is designed as a hollow structure defining a receiving space between when sandwiched by the first and the second substrates 11 and 12. Therefore, the electrical components 13 of the first and the second substrates 11 and 12 can be received therein during assembly. Furthermore, by the orientation of the FIG. 1, the top and bottom of the frame 14 has a welding pad 15 formed respectively thereon. The first substrate 11 is connected electrically to the second substrate 12 through the welding pad 15, the solders 16, and the frame 14.

Conventionally, for the conformal shielding technology, the first substrate 11 and the frame 14 are connected together, while the second substrate 12 and the frame 14 are connected together. Furthermore, a package layer (not labeled) will be disposed on the first substrate 11. During the latter coating process of the conductive layer, in order to prevent the conductive substances from penetrating into the gaps between the first substrate 11 and the frame 14, or the gaps between the second substrate 12 and the frame 14, an insulating colloid 17 will be injected therein to seal up the gaps. Specifically speaking, the colloid 17 made of a material selected from the group consisting of the epoxy resins or the thermosetting colloids and etc. The gaps on the periphery of the welding pads 15, and the gaps between the frame 14 and the first and the second substrates 11 and 12 will be sealed up using the colloid 17. Hence, the conductive substances can be avoided from contacting the welding pads 15 during the latter coating process. Nevertheless, the colloid 17 injection method requires multiple manufacturing processes which turn out to be economically disadvantageous. Furthermore, the amount, forming position . . . of the colloid upon injection is uneasy to be controlled. Thus, providing a simpler manufacturing process excluding the colloid injection will best enhance the production efficiency.

SUMMARY OF THE INSTANT DISCLOSURE

The object of the instant disclosure is to arrange the welding pads between the substrates and the frame so as to replace the colloids from the prior art. Therefore, the colloid injection process can be omitted to simplify the manufacturing method, and thereby increasing the production efficiency.

The instant disclosure provides a stacked substrate structure, including a substrate unit, a first frame, a conductive unit and a blocker unit. The substrate unit includes a first substrate and a second substrate, where each of the first and the second substrates has a plurality of electrical components placed thereon, and the first frame is arranged between the first and the second substrates. The conductive unit has a plurality of first conductors and a plurality of second conductors, where the first substrate and the first frame are connected through the first conductors, and where the second substrate and the first frame are connected through the second conductors, and the first and the second conductors are in electrical connection. The blocker unit has at least two first blockers and at least two second blockers, where the first blockers surroundingly arranged around the first conductors respectively, and the second blockers surroundingly arranged around the second conductors respectively. The first substrate and the first frame are connected in a sealed manner through the first blockers combined by the solder, while the second substrate and the first frame are connected in a sealed manner through the second blockers combined by the solder. The instant disclosure utilizes the solder which is a metallic alloy consisting essentially of tin, silver or copper for electrical connection of the first conductors on both the substrate and the frame, and electrical connection of the second conductors on both the substrate and the frame through the SMT process.

The instant disclosure further provides a stacked substrate structure, which includes a first substrate, a first frame, a plurality of first conductors and at least two first blockers. The first substrate includes a plurality of electrical components, and the first frame put together with the first substrate in a stacked manner. The first substrate and the first frame are connected through the plurality of first conductors, and the plurality of first conductors are respective surrounded by the first blockers. The first substrate and the first frame are connected in a sealed manner through the first blockers combined by the solder. The instant disclosure utilizes the solder (such as a metallic alloy consisting essentially of tin, silver or copper) for electrical connection of the first conductors on both the substrate and the frame through the SMT process.

Based on the above, the stacked substrate structure has blockers arranged between the substrates and the frames to prevent conductive substances from penetrating therethrough during the latter coating process. Thus, efficiently preventing conditions such as short-circuits or disorders from happening. Furthermore, the blockers of the instant disclosure act as the replacements of the colloids from the prior arts, and since the blockers and the conductors of the instant disclosure are manufactured in the same process, the injection process of colloids can be excluded. Thus, providing a simplified manufacturing method with enhanced production efficiency.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

The First Embodiment

Figure 1:
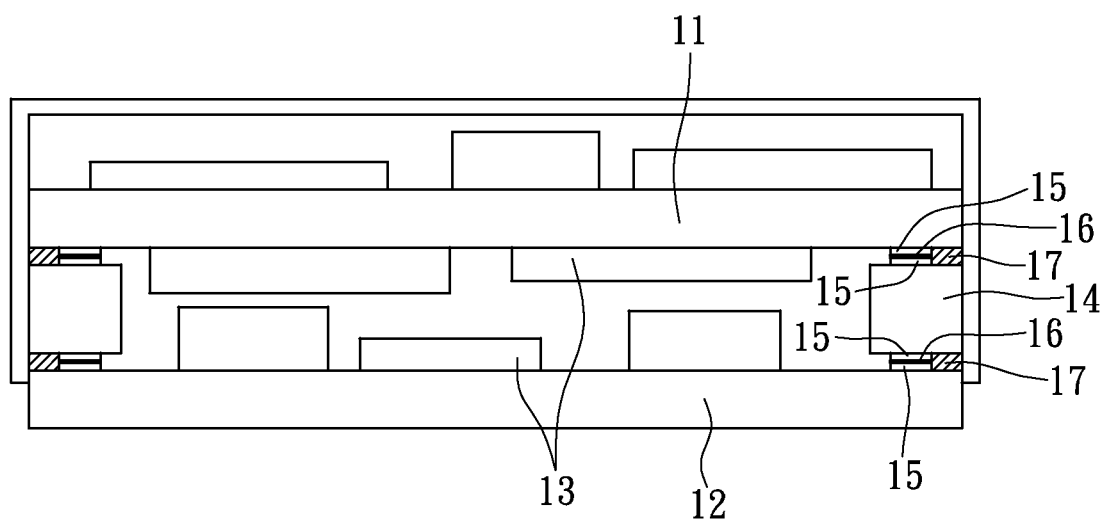
FIG. 1 shows a cross-sectional view of a stacked substrate structure of the prior arts.
Figure 2:
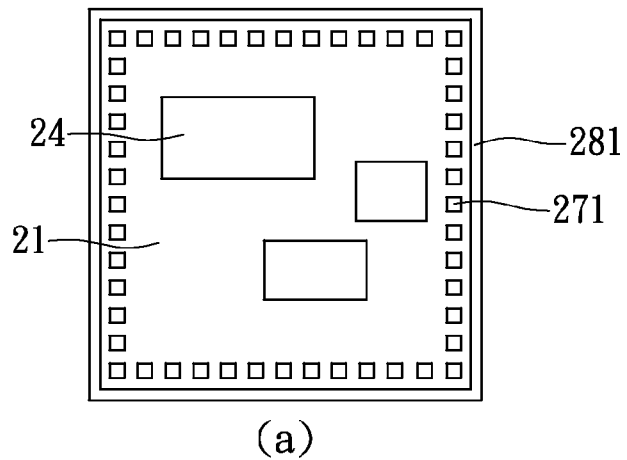
FIG. 2 shows an exploded schematic view of a stacked substrate structure according to the first embodiment of the instant disclosure.
Figure 2:
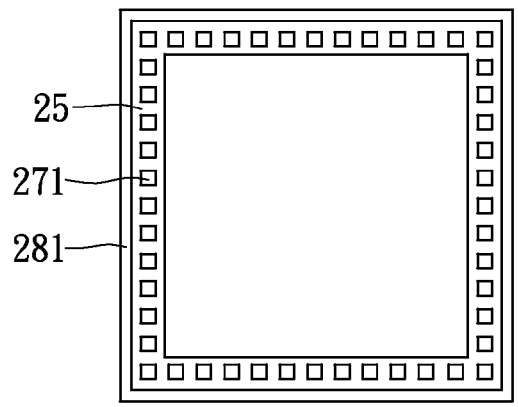
Figure 2:
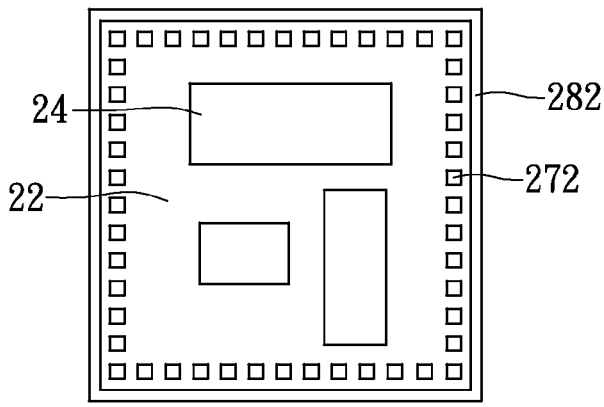
Figure 3:
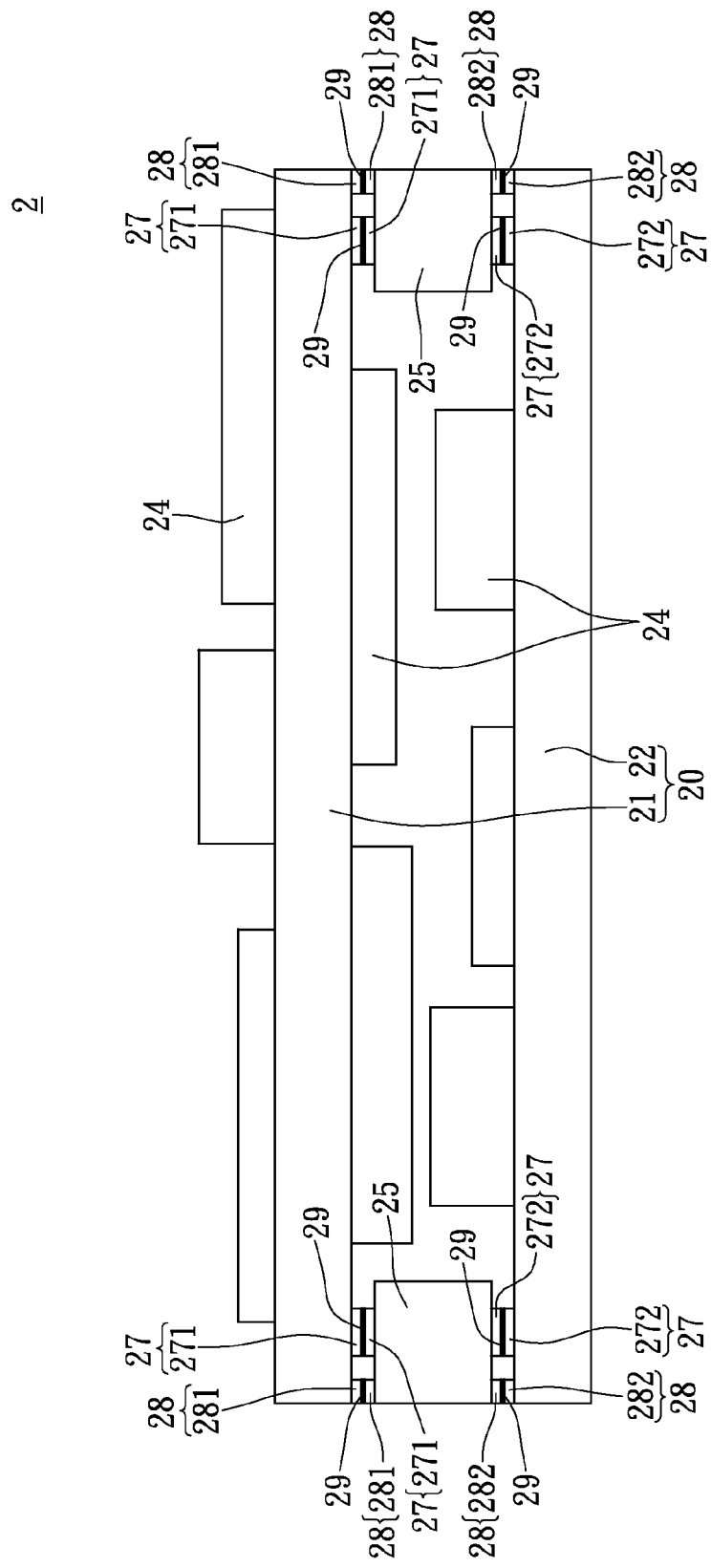
FIG. 3 shows an cross-sectional view of the stacked substrate structure according to the first embodiment of the instant disclosure.

Please refer to FIGS. 2-3, a stacked substrate structure 2 is provided in the instant disclosure, comprising a substrate unit 20, a first frame 25, a conductive unit 27, and a blocker unit 28, where the substrate unit 20 includes a first substrate 21 and a second substrate 22. For the orientation of the components, please refer to FIG. 2(a) for the first substrate 21 and FIG. 2(c) for the second substrate 22. During assembly, the first and the second substrates 21 and 22 are put together in a stacked manner, where both substrates 21 and 22 have a plurality of electrical components 24 placed thereon. Specifically, the first and the second substrates 21 and 22 may be printed circuit boards.

Furthermore, a first frame 25 can be arranged between the first and the second substrates 21 and 22. For the orientation of the first frame 25, please refer to FIG. 2(b). In other words, the three components cooperatively form a stacked structure where the first substrate 21 is stacked on the first frame 25 with the second substrate 22 below the first frame 25. For the instant embodiment, the first frame 25 can be, but not limited to, a square-shaped, a polygonal-shaped, or a circular-shaped frame structure. Furthermore, since the first frame 25 is a hollow structure, when the first frame 25 is arranged between the first and the second substrates 21 and 22, a receiving space will be cooperatively defined therebetween for receiving the electrical components 24 of the first and the second substrates 21 and 22. The first frame 25 can be designed in a manner that enables electrical connection between the first and the second substrates 21 and 22, where the actual design thereof should be made in accordance with practical needs without being restricted to the example illustrated in the instant embodiment.

The conductive unit 27 includes a plurality of first conductors 271 and a plurality of second conductors 272, where the plurality of first conductors 271 are formed on both the first substrate 21 and the first frame 25, while the plurality of second conductors 272 are formed on both the second substrate 22 and the first frame 25. Therefore, the first substrate 21 and the first frame 25 can be in electrical connection through the first conductors 271, while the second substrate 22 and the first frame 25 can be in electrical connection through the second conductors 272. To provide further explanations, a solder 29 is utilized between the first conductors 271 of both the first frame 25 and the first substrate 21, where the solder 29 enables electrical connection between the first frame 25 and the first substrate 21 after a SMT process. Similarly, the solder 29 is also utilized between the second conductors 272 of both the second substrate 22 and the first frame 25 for electrical connection therebetween after the SMT process. Specifically speaking, the solder 29 is a metallic alloy consisting essentially of tin, silver or copper. Preferably, the first and the second conductors 271 and 272 can be welding pads for instance.

In addition, the first frame 25 possesses characteristics such as signal transmission and electrical conduction that enables the first and the second conductors 271 and 272 to be connected electrically. Furthermore, the transmission of the circuit signals between the first and the second substrates 21 and 22 is described in the following. As in detail, the circuit signals emitted from the first substrate 21 are transmitted to the first frame 25 through the first conductors 271, and then the signals are transmitted to the second conductors 272 through the first frame 25. Eventually, the circuit signals are transmitted to the second substrate 22 through the second conductors 272. The circuit signals, however, can also be transmitted in the opposite direction. For instance, the circuit signals can be transmitted from the second substrate 22 to the second conductors 272, then to the first frame 25, the first conductors 271, and eventually to the first substrate 21. Furthermore, circuits can also be designed on the first frame 25 for the first frame 25 to be circuit designable and, at the same time, capable of circuit signal transmission. The functions of the first frame 25, however, are not limited thereto.

The blocker unit 28 includes at least two first blockers 281 and at least two second blockers 282, where both the first and the second blockers 281 and 282 are one-pieced welding pads which surround the respective frame and substrate. Specifically speaking, the plurality of first conductors 271 are respective surrounded by the first blockers 281, where the first substrate 21 and the first frame 25 are connected in a sealed manner through the first blockers 281 combined by the solder 29. Similarly, the plurality of second conductors 272 are respective surrounded by the second blockers 282, where the second substrate 22 and the first frame 25 are connected in a sealed manner through the second blockers 282 combined by the solder 29. Thus, the utilization of the solders 29 in the first and the second blockers 281 and 282 enables the first frame 25 and the first substrate 21, and also the first frame 25 and the second substrate 22 to be connected in a sealed manner, and thereby, preventing unwanted substances from penetrating therethrough.

Please refer again to FIG. 2 for the manufacturing method of the stacked substrate structure 2. By the orientation of FIG. 2, both the bottom surface of the first substrate 21, and the upper surface of the first frame 25 have the first conductors 271 and the first blocker 281 formed respectively thereon. Similarly, both the lower surface (not labeled) of the first frame 25 and the upper surface of the second substrate 22 have the second conductors 272 and the second blocker 282 formed respectively thereon. Where the first and the second conductors 271 and 272 are disposed correspondingly, and where the first and the second blockers 281 and 282 are disposed correspondingly.

The following descriptions provide a reference for a method of assembling the substrate and the frame, and a method of designating the solders 29, however, the methods for performing such processes are not restricted thereto.

Figures 4A, 4B:
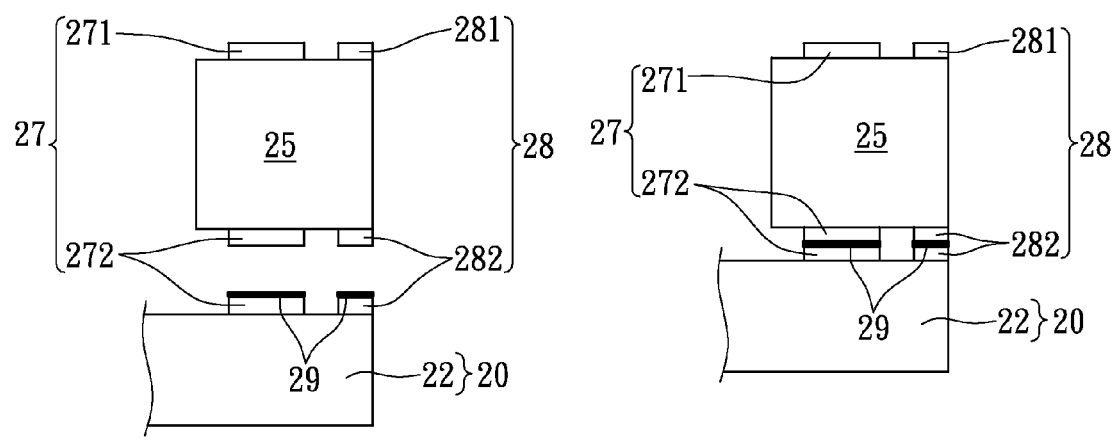
FIG. 4A shows a cross-sectional view of the stacked substrate structure of the instant disclosure where the solders are designated on second conductors of a second substrate and second blockers.
FIG. 4B shows a cross-sectional view of an assembly of a first frame and the second substrate of the stacked substrate structure in accordance to the instant disclosure.

Please refer to FIG. 4A, where the solders 29 are designated on the surfaces of the second conductors 272 of the second substrate 22, and the second blocker 282. Next, with reference to FIG. 4B, the second substrate 22 and the first frame 25 are put together in a stacked manner where the second conductors 272 and the second blocker 282 are attached through the solders 29. Followed on is the reflow process where the attached body is disposed into a high temperature furnace (such as an IR furnace) to be heated up, where the temperature ranges from 150 to 300° C. Ideally, the temperature is configured at 230° C. during the reflow process before the temperature is cooled down to room temperature. After the reflow and the cooling processes, the solders 29 will be solidified for the second substrate 22 and the first frame 25 to be in connection through the second conductors 272. Furthermore, the solders 29 on the second blocker 282 will enable the second substrate 22 and the first frame 25 to be connected in a sealed manner.

Figure 4C:
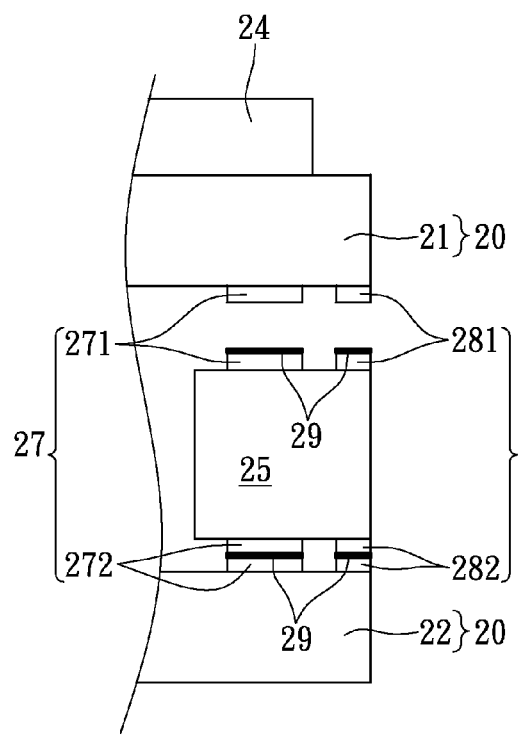
FIG. 4C shows a cross-sectional view of the stacked substrate structure of the instant disclosure where the solders are designated on first conductors of a first substrate and first blockers.
Figure 4D:
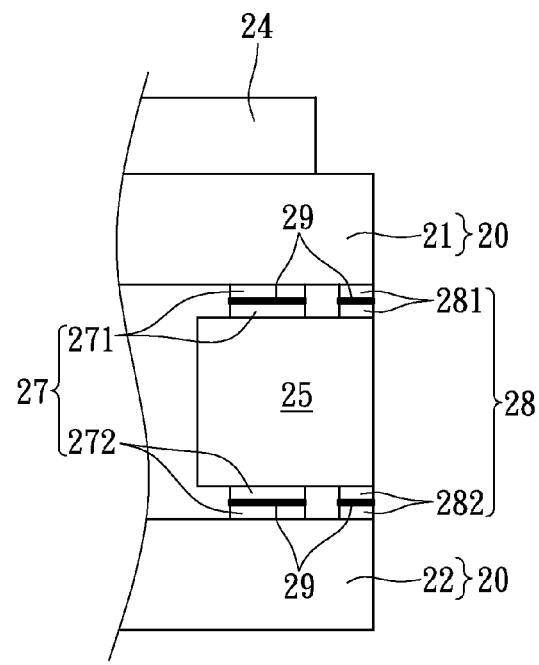
FIG. 4D shows a cross-sectional view of an assembly of the first frame and the first substrate of the stacked substrate structure in accordance to the instant disclosure.

With reference to FIG. 4C, the solders 29 can be formed on the surfaces of the first conductors 271 of the first frame 25, and the surface of the first blocker 281. Next, with reference to FIG. 4D, the first substrate 21 and the first frame 25 are put together in a stacked manner, where the first conductors 271 and the first blocker 281 are attached through the respective solders 29. After the reflow and cooling processes, the solders 29 will be solidified for the first substrate 21 and the first frame 25 to be in connection through the first conductors 271. Also, the solders 29 on the first blocker 281 will enable the first substrate 21 and the first frame 25 to be connected in a sealed manner. However, the sequence can be changed accordingly to the requirements. For instance, the solders 29 can be formed on the first conductors 271 and the first blocker 281 of the first substrate 21, before putting the first substrate 21 and the first frame 25 together in a stacked manner for the reflow process to begin. Next, the solders 29 are formed on the second conductors 272 and the second blocker 282 of the first frame 25 before putting the second substrate 22 and the first frame 25 together in a stacked manner for the reflow process to begin. Therefore, the sequence of the procedures is not limited thereto.

Based on the instant embodiment, it is concluded that all cases where a blocker is utilized between the substrates and the frames to prevent permeation of the conductive substances therethrough during the latter coating process belong to the claim coverage of the instant disclosure. Furthermore, the number of substrates and frames utilized, and the respective positions on the substrates and the frames are also not limited thereto.

Figure 5:
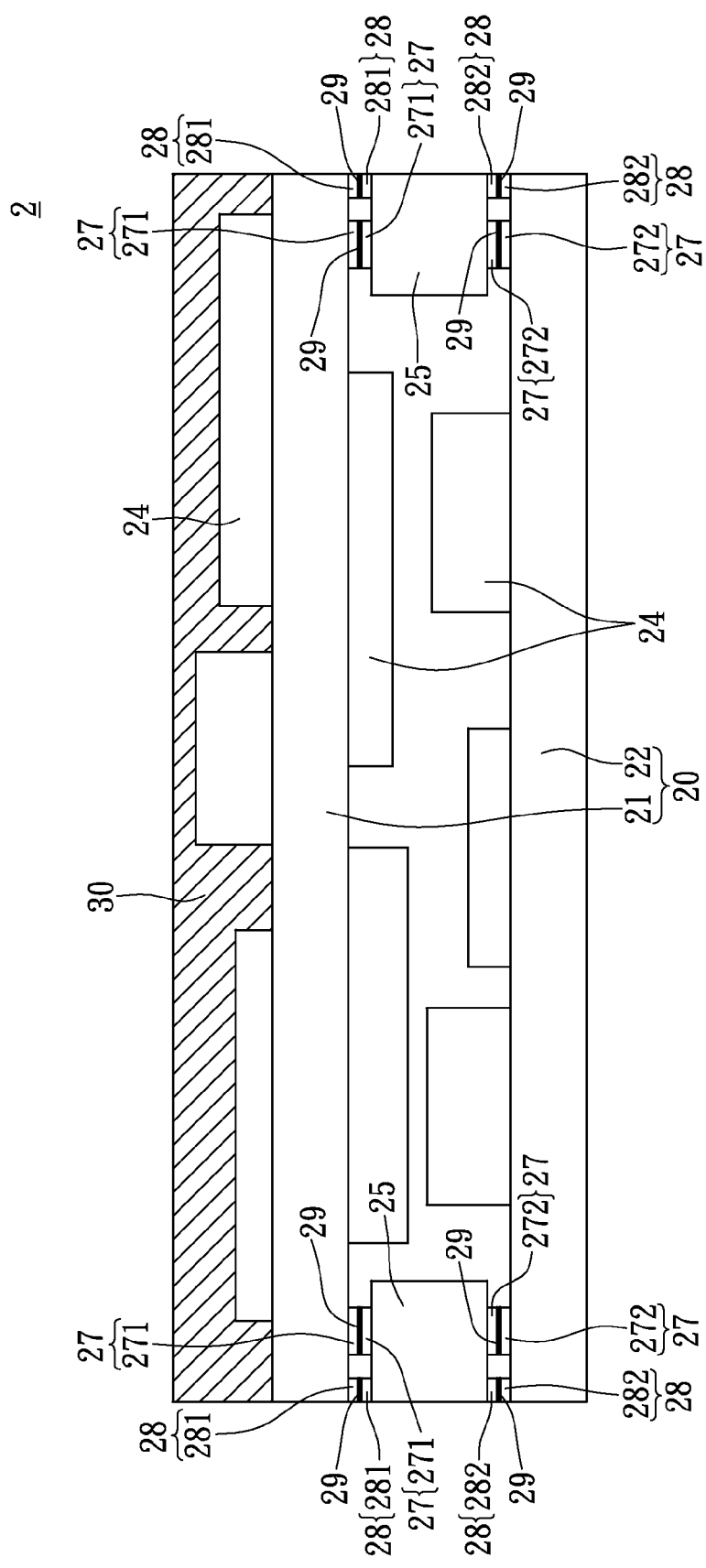
FIG. 5 shows a cross-sectional view of an additional package layer on the stacked substrate structure in accordance to the instant disclosure.
Figure 6:
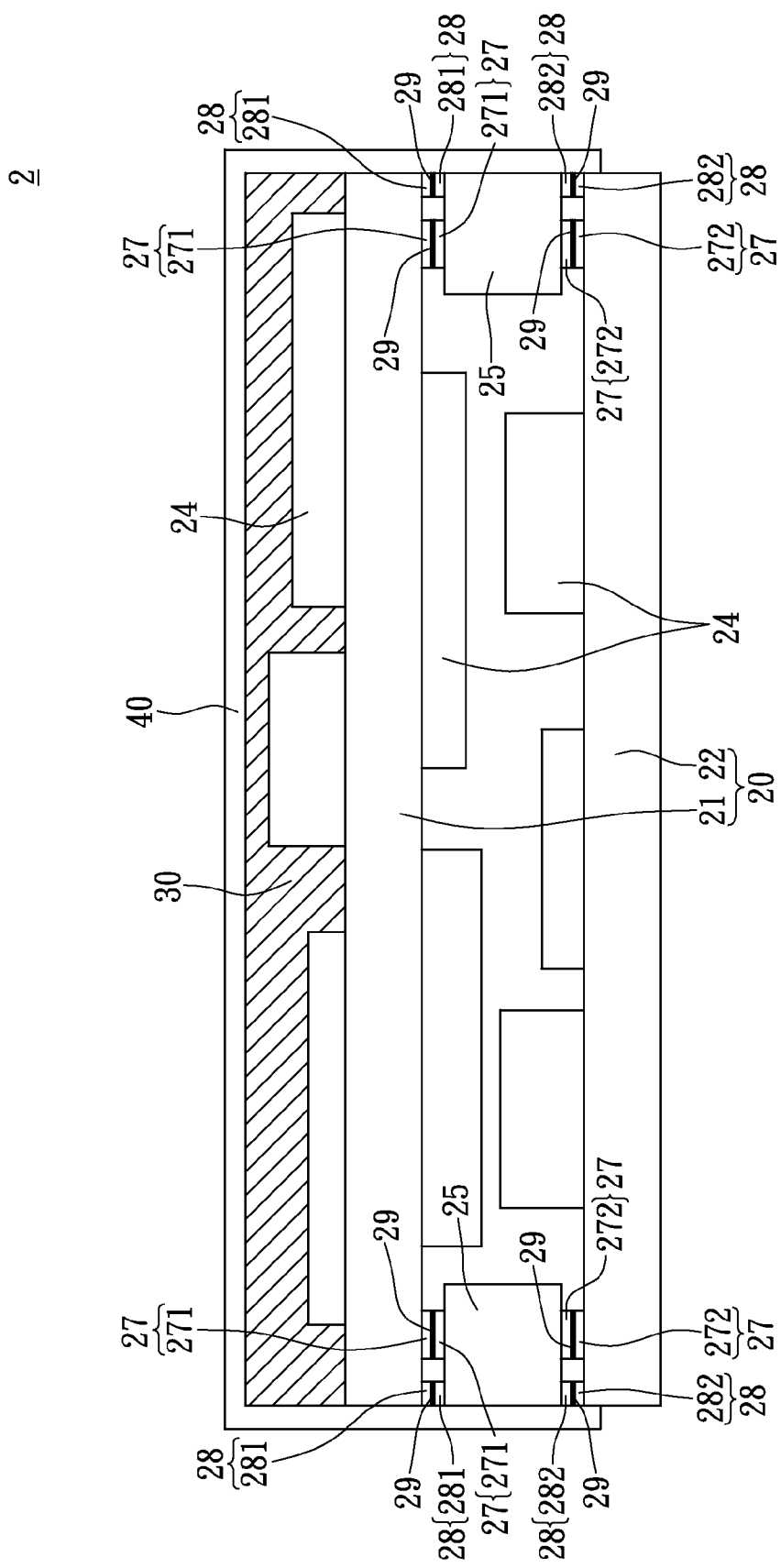
FIG. 6 shows a cross-sectional view of an additional electromagnetic shielding unit on the stacked substrate structure in accordance to the instant disclosure.

In addition, with reference to FIG. 5, a package layer 30 can be further formed on the first substrate 21 to protect the first substrate 21 and the electrical components 24. The package layer 30 can be made of different packaging materials, such as the epoxy resins or the thermosetting colloids and etc. Next, with reference to FIG. 6, an electromagnetic shielding unit 40 can be further formed on the outer surface of the package layer 30 and the side surfaces of the stacked substrate structure 2, where the electromagnetic shielding unit 40 is a conductive material capable of shielding electromagnetic waves. Notably, the forming method of the electromagnetic shielding unit 40 can be sputtering, chemical plating, electroplating, vapor deposition, or coating.

The Second Embodiment

Figure 7:
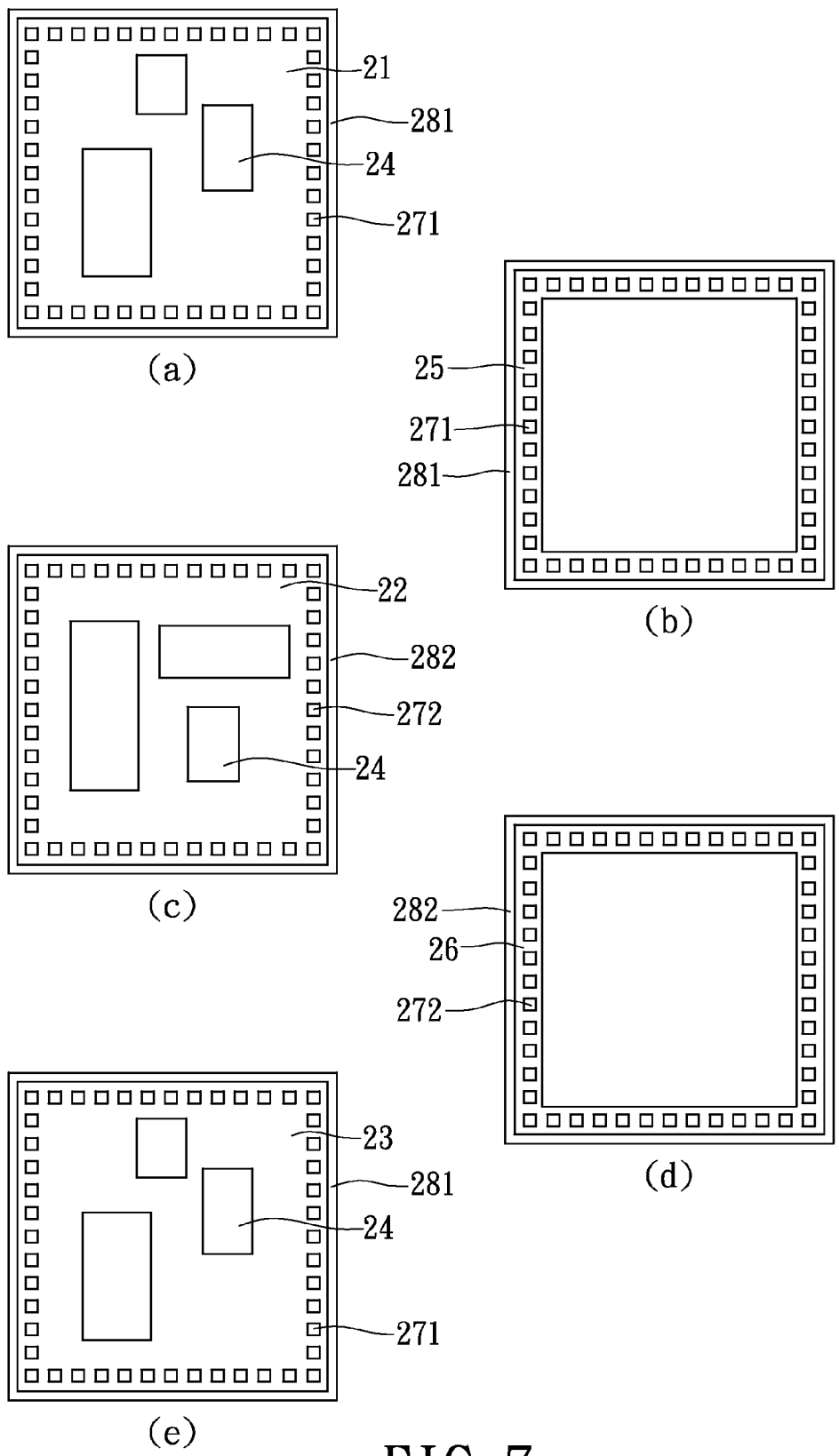
FIG. 7 shows an exploded view of the stacked substrate structure in accordance to the second embodiment of the instant disclosure.
Figure 8:
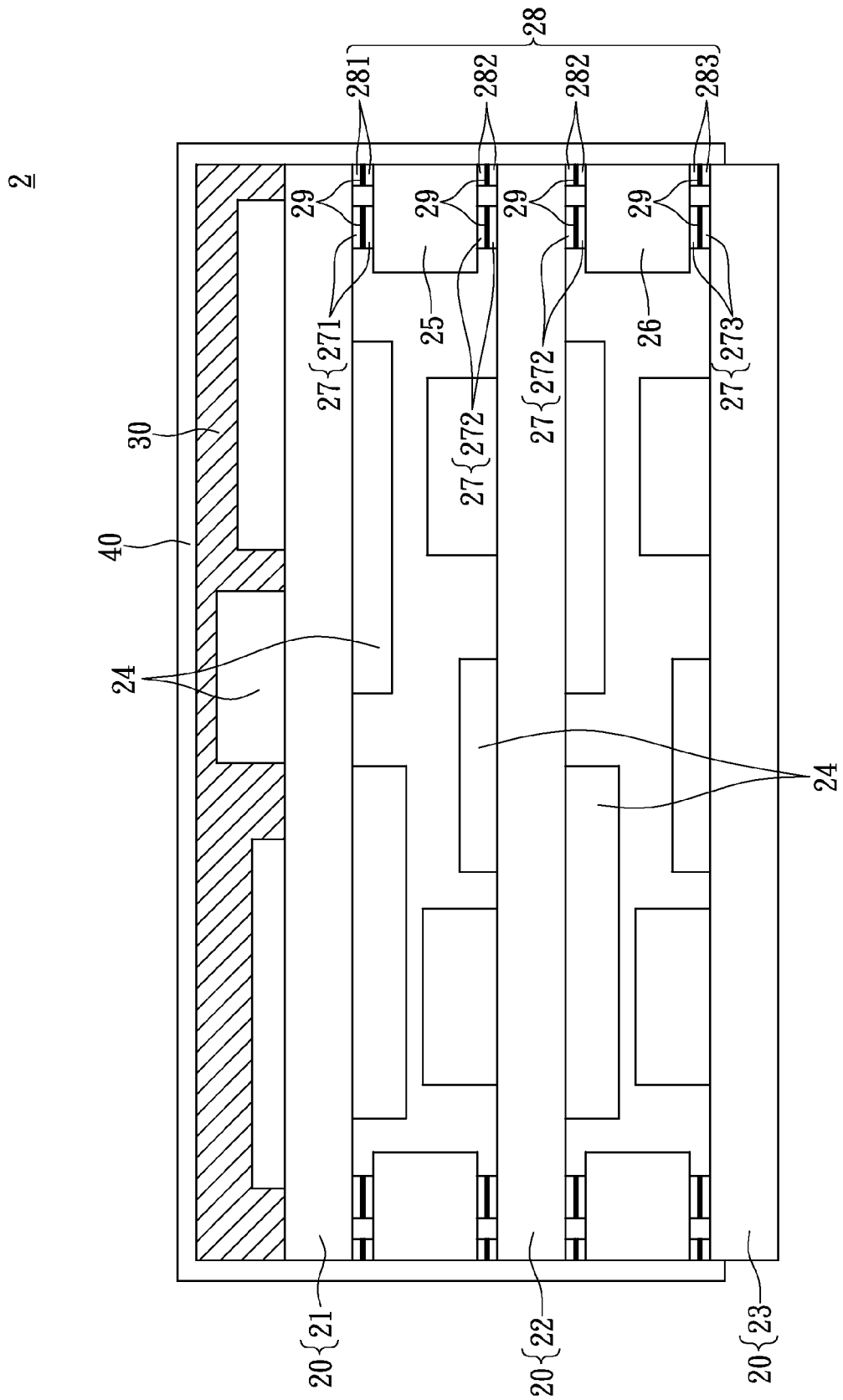
FIG. 8 shows a cross-sectional view of the stacked substrate structure in accordance to the second embodiment of the instant disclosure.

Please refer to FIGS. 7-8, the stacked substrate structure 2 of the second embodiment can be a concept extension from the preceding embodiment. In other words, an additional substrate and an additional frame can be stacked upon the substrate structure from the first embodiment. Therefore, by the orientation of the figures, a second frame 26 and a third substrate 23 can be further arranged under the second substrate 22 to form a stacked substrate structure 2, which includes three substrates and two frames. For an orientation of the components, please refer to FIG. 7(a) for the first substrate, FIG. 7(b) for the first frame, FIG. 7(c) for the second substrate, FIG. 7(d) for the second frame, and FIG. 7(e) for the third substrate.

Specifically speaking, the second conductors 272 are arranged on the bottom surface of the second substrate 22 and top surface of the second frame 26 with the solders 29 formed thereon for connection to the second frame 26. Similarly, the third conductors 273 are arranged on the bottom surface of the second frame 26 and the top surface of the third substrates with the solders 29 formed thereon for connection to the third substrate 23. To provide further explanations, the second blockers 282 are combined by the solder 29 and arranged between the second substrate 22 and the second frame 26, where the second blockers 282 surroundingly arranged around the plurality of second conductors 272 respectively. Similarly, the third blockers 283 are combined by the solder 29 and arranged between the second frame 26 and the third substrate 23, where the third blockers 283 surroundingly arranged around the plurality of third conductors 273 respectively. Therefore, the blockers are arranged between the substrates and the frames of the stacked substrate structure 2 of the second embodiment to prevent unwanted substances from penetrating therethrough. For the instant embodiment, the numbers of the third blocker 283 are two and the third blockers 283 are one-pieced welding pads which surround the substrates and the frame.

Please refer to the preceding embodiment for the manufacturing method of the stacked substrate structure 2 of the instant embodiment. The first, the second and the third conductors 271, 272 and 273 are disposed on the frames and the substrates, whereas the first, the second and the third blockers 281, 282 and 283 are disposed on the frames and the substrates as well. Next, the solders 29 are formed selectively on the surfaces of the first, the second and the third conductors 271, 272 and 273, and the first, the second and the third blockers 281, 282 and 283 before putting the first substrate 21, the first frame 25, the second substrate 22, the second frame 26 and the third substrate 23 together in a stacked manner, where the sequence of stacking the substrates is not limited thereto. The reflow and the cooling processes are then performed to solidify the solders 29. Consequently, the first, the second, and the third conductors 271, 272 and 273 will be connected to the respective substrates and frames through the solders 29, while the first, the second, and the third blockers 281, 282 and 283 will surroundingly arranged around the plurality of the respective first, the second, and the third conductors 273. Furthermore, the solders 29 on the blockers will enable the connection of the substrates and the frames to be in a sealed manner.

Furthermore, other embodiments can also be extended through the concept of the second embodiment. For instance, at least one more substrate and one frame can be stacked on the third substrate 23 to form a stacked substrate structure 2 having at least four layers of substrates. Therefore, the number of substrates can be adjusted in accordance to the requirements and is not restricted thereto.

Next, a package layer 30 can be further disposed on the first substrate 21 for protection of the first substrate 21 and the electrical components 24. The package layer 30 can be made of different packaging materials, such as the epoxy resins or the thermosetting colloids and etc. Next, an electromagnetic shielding unit 40 can be further formed on the outer surface of the package layer 30 and the side surfaces of the stacked substrate structure 2, where the electromagnetic shielding unit 40 is a conductive material capable of shielding electromagnetic waves. Notably, the forming method of the electromagnetic shielding unit 40 can be sputtering, chemical plating, electroplating, vapor deposition, or coating.

The Third Embodiment

Figure 9:
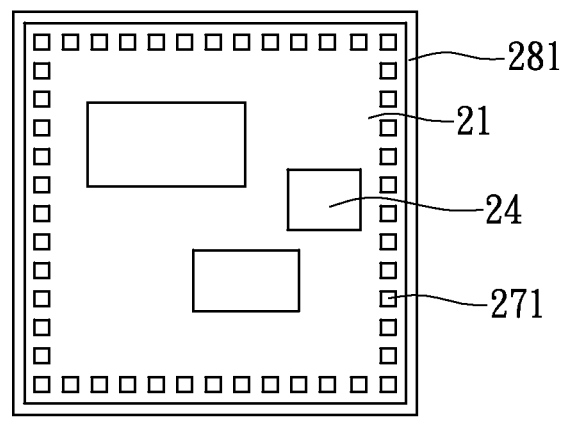
FIG. 9 shows an exploded view of the stacked substrate structure in accordance to the third embodiment of the instant disclosure.
Figure 9:
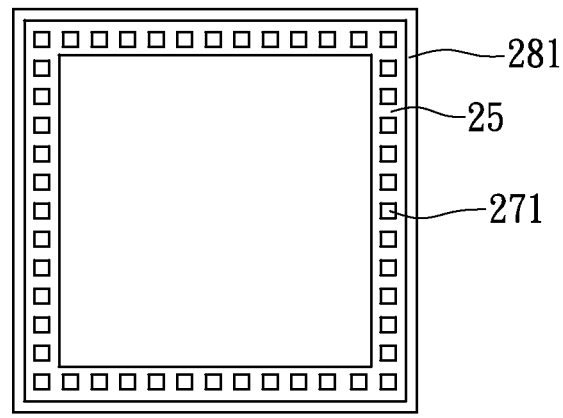
Figure 10:
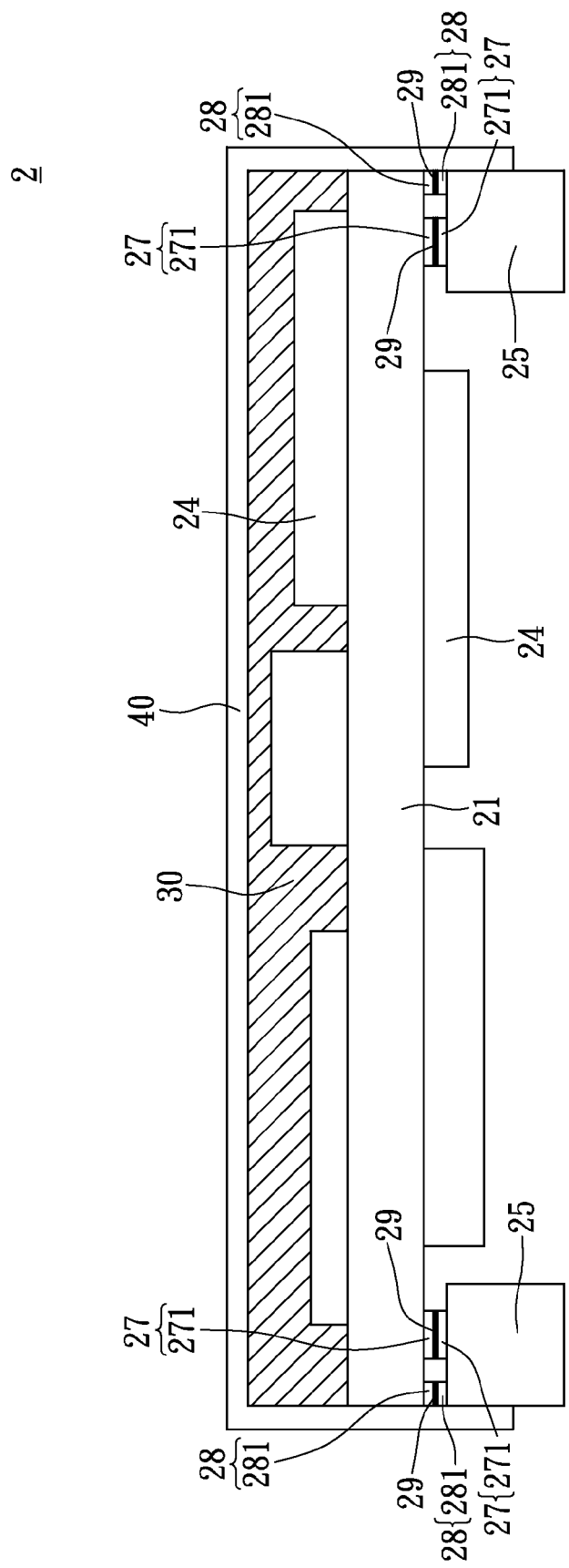
FIG. 10 shows a cross-sectional view of the stacked substrate structure in accordance to the third embodiment of the instant disclosure.

With reference to FIGS. 9-10, the third embodiment provides a stacked substrate structure 2 which includes a first substrate 21, a first frame 25, a plurality of first conductors 271, and at least two first blockers 281. For an orientation of the components, please refer to FIG. 9(a) for the first substrate 21, and FIG. 9(b) for the first frame 25. The first substrate 21 can be a printed circuit board, where the first frame 25 is arranged adjacently thereto. Since the first frame 25 is a hollow structure, where the first frame 25 and the first substrate 21 are put together in a stacked manner, a receiving space will be defined cooperatively therein to receive the electrical components 24 of the first substrate 21. Furthermore, the first frame 25 has also characteristics of electricity conduction and signal transmission.

The first substrate 21 and the first frame 25 are connected through the plurality of first conductors 271 formed respectively thereon. Specifically speaking, the plurality of first conductors 271 of the respective first substrate 21 and the first frame 25 has solders 29 formed thereon, where the solders 29 will be connected to provide electrical conduction after the SMT process. Notably, the first conductor 271 is a welding pad. In addition, two first blockers 281 surroundingly arranged around the plurality of first conductors 271 respectively. The solders 29 formed on the first blockers 281 will enable the first substrate 21 and the first frame 25 to be connected in a sealed manner. For the instant embodiment, the first blocker 281 is a one-pieced welding pad which surrounds the substrate and the frame.

Please refer to the first embodiment for the manufacturing method of the stacked substrate structure 2 of the instant embodiment. The plurality of first conductors 271 is arranged in both the first substrate 21 and the first frame 25, and at least two first blockers 281 are arranged peripherally on both the first substrate 21 and the first frame 25. Next, the solders 29 are formed selectively on the surfaces of the first conductor 271, and the first blocker 281 before putting the first substrate 21 and the first frame 25 together in a stacked manner. The reflow and the cooling processes are then performed to solidify the solders 29 on the first conductors 271 for the first substrate 21 and the first frame 25 to be in connection. Furthermore, the first blocker 281 surroundingly arranged around the plurality of first conductors 271. The solders 29 on the first blockers 281 will enable the first substrate 21 and the first frame 25 to be connected in a sealed manner.

Next, a package layer 30 can be formed on the first substrate 21 to protect the first substrate 21 and the electrical components 24. The package layer 30 can be made of different packaging materials, such as the epoxy resins or the thermosetting colloids and etc. Additionally, an electromagnetic shielding unit 40 can be further formed on the outer surface of the package layer 30 and the side surfaces of the stacked substrate structure 2. The electromagnetic shielding unit 40 is a conductive material capable of shielding electromagnetic waves. Notably, the forming method of the electromagnetic shielding unit 40 can be sputtering, chemical plating, electroplating, vapor deposition, and coating.

Based on the above, the instant disclosure has the following advantages:

1. The stacked substrate structure has blockers arranged between the substrates and the frames to prevent conductive substances from penetrating therethrough during the latter coating process. Thus, efficiently preventing conditions such as short-circuits or disorders from happening.

2. The blockers of the instant disclosure act as the replacements of the colloids from the prior arts, and since the blockers and the conductors of the instant disclosure are manufactured in the same process, the injection process of colloids can be excluded. Thus, providing a simplified manufacturing method with enhanced production efficiency.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A stacked substrate structure, comprising:
   a substrate unit (20) including a first substrate (21) and a second substrate (22), each of the first and the second substrate having at least an electrical component (24) placed thereon;
   a frame (25) arranged between and separating the first and the second substrates, comprising:
   a conductive unit (27) including a plurality of opposingly arranged first conductors (271) and second conductors (272),
   wherein the first substrate and the frame are connected through solders (29) on the first conductors,
   wherein the second substrate and the frame are connected through the solders (29) on the second conductors,
   wherein the first and the second conductors are in electrical connection, and
   a blocker unit (28) including at least two first blockers (281) and at least two opposingly arranged second blockers (282);
   the first blockers being a continuously enclosing conductive structure surroundingly and substantially coplanarly arranged around the first conductors, and
   the second blockers being a continuously enclosing conductive structure surroundingly arranged around the second conductors, respectively,
   wherein the first substrate and the first frame are connected in a sealed manner through the first blockers combined by solder, wherein the second substrate and the frame are connected in a sealed manner through the second blockers combined by solder.

2. The stacked substrate structure according to claim 1, wherein the first and the second substrates are printed circuit boards, and the first and the second conductors are welding pads, and wherein the first and the second blockers are one-pieced welding pads surrounding the frames and the substrates.

3. The stacked substrate structure according to claim 1, wherein the frame is a hollow structure which defines a receiving space therein for receiving the electrical components of the first and the second substrates, and wherein the frame provides electrical connection and signal transmission.

4. The stacked substrate structure according to claim 1, wherein the plurality of first and second conductors provide connection through the solders formed thereon after the reflow process, and wherein the first and the second blockers provide connection through the solders formed thereon after the reflow process.

5. The stacked substrate structure according to claim 1, further comprising: a package layer formed on the first substrate; and an electromagnetic shielding unit formed on the outer surface of the package layer, and the side surfaces of the stacked substrate structure.

\* \* \* \* \*